Jan. 3, 1967 A. D. REICH 3,296,034

THERMOELECTRIC ASSEMBLY AND METHOD OF FABRICATION

Filed Jan. 4, 1962

Inventor:
Allen D. Reich
By: C. G. Stallings
Atty.

United States Patent Office 3,296,034
Patented Jan. 3, 1967

3,296,034

THERMOELECTRIC ASSEMBLY AND METHOD OF FABRICATION

Allen D. Reich, Des Plaines, Ill., assignor to Borg-Warner Corporation, Chicago, Ill., a corporation of Illinois Filed Jan. 4, 1962, Ser. No. 164,334
5 Claims. (Cl. 136—212)

This invention relates to thermoelectric devices that rely on the Peltier effect to transfer heat energy from a first to a second point. More particularly, the invention relates to means and methods for cascading a plurality of thermoelectric elements into an integrated assembly that possesses optimum physical, thermal, and electrical characteristics.

The basic principles of thermoelectricity have now been known for over a century, having originated with the findings of Seebeck and Peltier around the advent of the nineteenth century. The Seebeck effect focuses on the fact that when the ends of a metal wire are joined to the ends of a wire of dissimilar metal to form a continuous electrical path, and the two junctions thus formed are maintained at different temperatures, there will be an electromotive force generated between the two junctions and an unidirectional electrical current flow in the wires. The magnitude and direction of the current will depend on the metals employed, the temperatures of the junctions, the temperature differential between the junctions, and other factors. The Peltier effect is the converse of the Seebeck effect, the Peltier phenomenon occurring when an unidirectional current flows through a continuous path formed by joining the ends of a metal wire to the ends of a wire of dissimilar metal. If an unidirectional current is made to flow through the dissimilar wires so joined at their ends, heating of one junction occurs while the other junction simultaneously is cooled.

Thermoelectric devices that have employed the Peltier effect were of very low efficiency and heat pumping capacity to the development of solid state materials. Such thermoelectric materials include bismuth telluride and antimony telluride which have very carefully controlled quantities of "donor" or "acceptor" impurities distributed uniformly therewithin.

There are two general types of thermoelectric materials of the aforesaid solid state nature, designated as p-type and n-type. Functionally speaking, the difference between a p-type and an n-type material is as follows. When current flows through a p-type material the portion or junction where the current enters is cooled, whereas the portion or junction where the current exits is heated. The opposite cooling and heating effects occur in an n-type thermoelectric material.

P-type and n-type thermoelectric materials are generally fabricated into short thin rods called thermoelectric elements or thermoelements. Due to the extremely small temperature differential and heat pumping capacity achievable with a single thermoelement, design practice has been to connect a large number of p-type and n-type thermoelements in electrical series to increase the rate of heat transfer or heat pumping capacity, and in thermal series to increase the temperature differential. Most thermoelement configurations incorporate both electrical and thermal series connections since temperature differential and heat pumping capacity are interdependent quantities.

The magnitude of electrical current that flows through the thermoelements in a particular electrical series is of vital importance in achieving optimum temperature differential and heat pumping capacity. Each electrical series, or stage, in a thermoelectric device usually requires an optimum magnitude of electrical current different from the other electrical series or stages, due to the dissimilar temperature limits and heat loads of the various stages. Thus electrical isolation between stages is dictated; at the same time however, thermal conductivity between stages must be maintained to effect optimum heat transfer efficiency. To effect this dual objective, the stages of thermoelements have been fabricated in the manner of a layer cake, wherein each layer includes a stage or plurality of thermoelements connected in electrical series, while adjacent layers are separated by a carrier or plate of electrically-nonconductive thermally-conductive material such as aluminum oxide. The plurality of thermoelements in each stage are parallel and extend axially between a pair of spaced adjacent plates. The ends of each thermoelement in each stage are joined to the opposed faces of the adjacent plates which define the stage or layer. This structural geometry will subsequently become more evident.

Presently, thermoelements are joined at the ends thereof to the faces of the plates primarily with glues, epoxy resins, silicone fluids, or by pressure contact. These joining techniques are unsatisfactory for several reasons.

Junctions formed by the present methods are of random quality, and therefore thermoelectric performance is unpredictable. The problems of occluded gases, heterogeneity, fracturing, arcing, erosion, corrosion and variable contact surface are unavoidably present due to the inherent characteristics of these junctions.

The aforesaid methods also produce high electrical contact resistance, i.e., the voltage drops across such junctions are excessively high, thereby reducing the net voltage available to operate the thermoelements themselves. This fact has placed practical restrictions on thermoelement design characteristics. High contact resistance also dissipates input energy in a nonuseful manner, and it further increases the heat load that must be pumped by useful input energy to achieve a given temperature differential and net heat transfer rate.

Since heat energy must be conducted not only through the plates of a thermoelectric device, but also through the junctions between the thermoelements and the plates, the relatively low thermal conductivity of conventional junctions imposes severe limitations on the overall heat transfer rate and temperature differential attainable in any given thermoelectric system.

The alternately high and low heat fluxes that exist at thermoelement junctions generate thermal shock forces, thereby deteriorating and rendering ineffective many present junction materials. This adverse condition is prevalent particularly in junctions of low thermal conductivity.

The junctions between thermoelements and plates may serve not only as electrical and thermal bonds, but also as the means for physically integrating the entire thermoelectric device in many cases. Glues and epoxy resins due to considerations previously discussed are unreliable for structural purposes, whereas silicone fluids and pressure contacts are totally unsuitable therefor.

Frequently it is desired to employ a thermoelectric device in an evacuated environment, e.g., in conjunction with a radiation detection system. The relatively high vapor pressures of glues, resins, fluids and the like prevent the sustained maintenance of a high degree of vacuum in such systems.

An object of the present invention is to provide a means and method for joining thermoelements to a carrier or plate that is reliable, uniform, stable and durable.

Another object of the invention is to provide a means and method for joining thermoelements to a plate in which there is minimum electrical contact resistance, negligible nonuseful input energy dissipation, and minimal parisitic heat loading.

It is also an object of the invention to provide a means and method for joining thermoelements to a plate to effect both high thermal conductivity therebetween and selective electrical isolation between the thermoelements.

A further object of the invention is to provide a means and method for joining thermoelements to a plate in which the junctions will not deteriorate when subjected to alternately high and low heat fluxes or to other thermal shock forces.

Still another object of the invention is to provide a means and method for joining thermoelements to a plate in which the junctions serve to structurally integrate all members in addition to effecting electrical and thermal bonding.

An additional object of the invention is to provide a means and method for joining thermoelements to a plate in which the vapor pressure of the junctions is insignificant in the presence of a highly evacuated environment.

The aforesaid and other objects are achieved through the invention, in one of its forms, by providing a thin aluminum oxide plate, preparing said plate to receive a layer of electrically-conductive silver preparation, applying and firing a layer of electrically-conductive silver preparation on said plate, electroplating a layer of copper on said layer of silver preparation, tinning said layer of electroplated copper with soft solder, removing said silver preparation, copper, and soft solder from selected portions of said plate, providing a plurality of relatively thick copper bars, and soldering a copper bar to selected metallized portions of said plate.

The objects of the invention, and the means and methods for the accomplishment thereof, will be best understood from the following detailed description and the accompanying drawing, in which.

Figures 1, 2, 3:
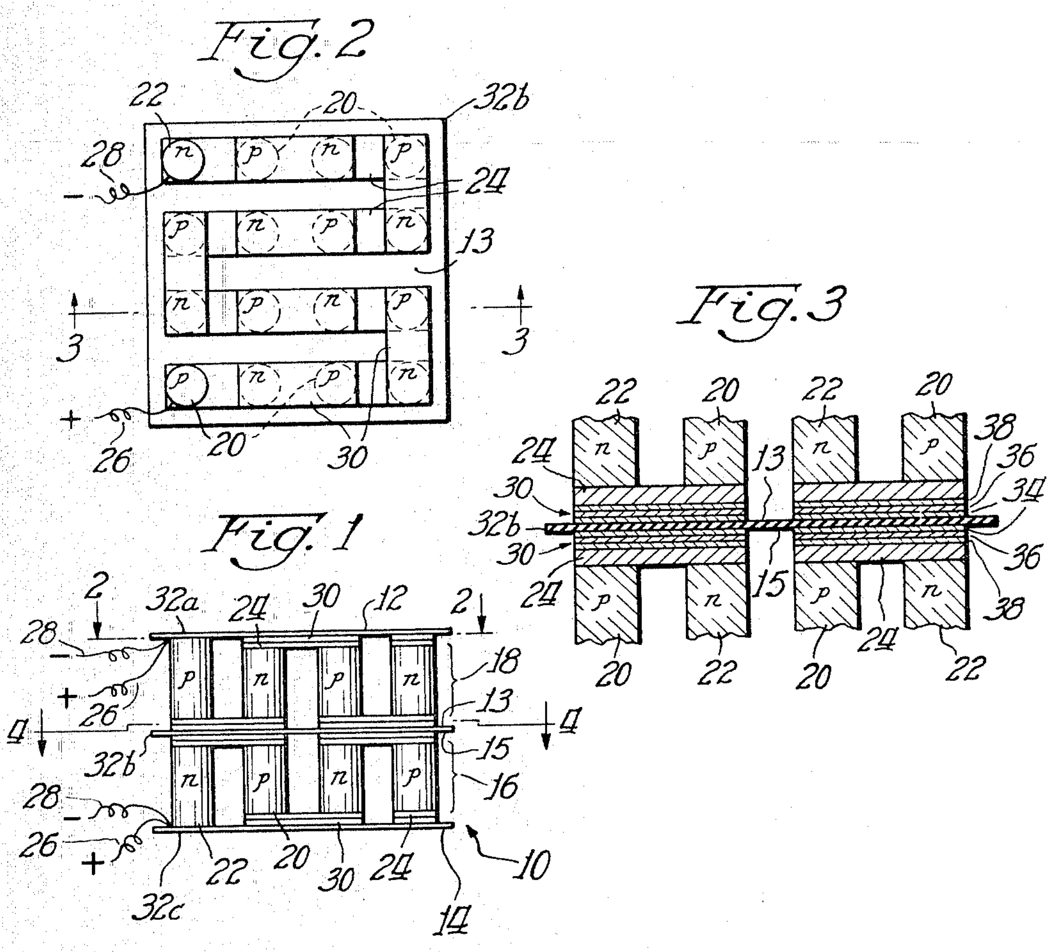
FIG. 1 is a view of a cascaded two-stage thermoelectric device showing alternate p-type and n-type thermoelements connected in electrical series in each stage, the cold junctions of the first or lower stage being thermally-integrated with the hot junctions of the second or upper stage.
FIG. 2 is a view taken along line 2—2 of FIG. 1 showing a four-by-four square array of thermoelements in the second stage.
FIG. 3 is an enlarged fragmentary sectional view taken along line 3—3 of FIG. 2 showing in detail the junctions between the thermoelements and an interstage plate which serves as a carrier and a separator for the thermoelements.

Referring now to FIGS. 1 and 2, a thermoelectric device 10 including a cold terminal surface 12, a hot terminal surface 14, a hot intermediate surface 13, and a cold intermediate surface 15, is shown. Thermoelectric device 10 is generally comprised of a first stage 16 and a second stage 18 which are illustrated for convenience, respectively, as lower and upper stages. Thermoelectric device 10 may be comprised of more or less than two stages 16 and 18 depending upon design objectives. Stages 16 and 18 each include a plurality of cylindrical p-type thermoelements 20 and n-type thermoelements 22 that are disposed in spaced parallel relationship to form an array of alternating p-type and n-type thermoelements. As shown in FIGS. 1–2, the ends of thermoelements 20 and 22 are joined to electrically-conductive bars 24 to form an electrical series network of alternate p-type and n-type thermoelements in each stage 16 and 18. The first and last thermoelements of the electrical series network in each stage 16 and 18 each have a terminal end to which either a positive electrical lead 26 or a negative electrical lead 28 is connected. In second stage 18, as shown in FIG. 2, positive lead 26 is connected to a p-type thermoelement 20 and negative lead 28 is connected to an n-type thermoelement 22, while the converse is true with respect to first stage 16. The manner of connection of leads 26 and 28 to thermoelements 20 and 22 is easily determined in any situation by considering which of the terminal surfaces 12 and 14 is to be cooled.

Each bar 24 is joined by a thermally-conductive junction 30, to be subsequently described, to a thin carrier or plate 32 of an electrically-nonconductive thermally-conductive material such as aluminum oxide, especially sapphire. The two-stage thermoelectric device 10 of FIG. 1 is seen to include three of such plates 32*a*, 32*b*, and 32*c*. Plates 32*a*, 32*b*, and 32*c* all serve as carriers, whereas plate 32*b* further functions as an interstage separator between stages 16 and 18. Thermoelements 20 and 22, the ends of which are joined to bars 24, thus extend longitudinally between adjacent spaced pairs of plates 32 in columnlike fashion, as shown in FIG. 1. Since plates 32, junctions 30, bars 24, and thermoelements 20 and 22 are all thermally-conductive, a relatively unimpeded path for heat flow exists between terminal surfaces 12 and 14. Due to the electrically-nonconductive nature of plates 32 however, there is electrical isolation between stages 16 and 18, and between thermoelements 20 and 22 within each stage except as provided by bars 24. Thermoelements 20 and 22 of first stage 16 may thus be electrically energized independently of the thermoelements of second stage 18. At the same time however, heat energy absorbed at cold terminal surface 12 is readily transferred in sequence to hot intermediate surface 13, cold intermediate surface 15, and hot terminal surface 14 to be expelled thereat.

Referring now to FIG. 3 for a more detailed description of junctions 30, each junction is seen to be comprised of a thin strip or ribbon 34 of an electrically-conductive metallic preparation bonded to plate 32, a ribbon 36 of metal electroplated on ribbon 34, and a ribbon 38 of metallic alloy joined to ribbon 36. Each bar 24 is sandwiched between a ribbon 38 and the ends of a pair or couple of thermoelements 20 and 22, thereby electrically connecting the ends of the thermoelement couple while placing the ends in thermal communication with plate 32.

A preferred method for fabricating a carrier or plate 32 with a plurality of junctions 30 thereon will now be presented. A commercially-available thin sapphire plate, e.g., 0.010 inch thick, of suitable length and width is surface ground to a rough finish as with a #100 grit diamond wheel. Except in the most critical applications, a random crystal axis orientation in the sapphire plate is permissible. The sapphire plate is chemically cleaned, e.g., with carbon tetrachloride, after surface grinding to provide surfaces that are free of foreign matter.

An electrically-conductive metallic preparation, for example, a commercially available silver paste composition, is then applied to one entire surface of the sapphire plate with a micro spatula or the like. The sapphire plate with the layer of silver paste thereon is then fired in an electric oven at about standard pressure, and at about 1300–1400° F. Firing bonds the metallic preparation tenaciously to the surface of the sapphire plate in a uniform manner.

Copper is then electroplated on the fired layer of metallic preparation; a suitable copper plating bath is as follows:

| | |
|---|---|
| Copper sulfate crystals | 27 oz./gal. |
| Sulfuric acid | 6.5 oz./gal. |
| Temperature | 75°–120° F. |
| Current density | 15–40 amps./sq. ft. |
| Voltage | 0.75–2 volts. |
| Anodes | Rolled annealed copper. |
| Time | 10 min. |

After electroplating with copper, a layer of soft solder, e.g., 50% tin–50% lead, is sweated or tinned onto the copper at below 500° F. using a resin flux if desired.

When the successive layers of fired silver preparation, electroplated copper, and soft solder have been applied to one entire surface of the sapphire plate, any desired circuit pattern may be created thereafter by removing with an abrasive cutter or the like, selected portions of the three metallic layers to a depth that exposes the sapphire plate.

If it is desired to form circuit patterns on both surfaces of the sapphire plate, as in the case of interstage carrier or plate 32_b_, then the method applications taught heretofore are made simultaneously to both surfaces of the sapphire plate rather than to only one surface.

Figure 4:
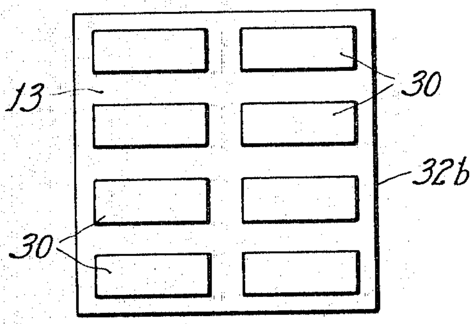
FIG. 4 is a view taken along line 4—4 of FIG. 1 showing a circuit pattern composed of junctions on one of the plate surfaces.

Referring now to FIG. 4, a circuit pattern is shown for the hot intermediate surface 13 of interstage plate 32_b_. This circuit pattern is formed by removing with an abrasive cutter the soft solder, electroplated copper, and fired silver preparation from selected portions of the sapphire plate surface to effect a plurality of electrically-segregated thermally-integrated junctions 30. The layer of fired silver preparation thus becomes a plurality of ribbons 34, the layer of electroplated copper thus becomes a plurality of ribbons 36, and the layer of soft solder thus becomes a plurality of ribbons 38.

Bars 24 for thermoelectric device 10 may be formed of relatively thick copper sheet, e.g. $\frac{1}{32}$–$\frac{3}{64}$ inch thick, the bars conforming to the geometry of junctions 30 to which the bars are joined as by soldering. The ends of thermoelements 20 and 22 are then soldered or otherwise suitably joined to bars 24. Bars 24 are of low electrical resistance thereby preventing any appreciable voltage drop, joule heat loading, input energy dissipation, or thermal shock at junctions 30. The dimensions of bars 24 will be controlled primarily by the current load that the bars must carry.

Having thus described and illustrated the means and methods of the invention, it is now appreciated that the objects thereof are accomplished thereby.

Since the plurality of junctions 30 on the surfaces of plates 32 are formed from laminated layers, each layer initially being a uniform continuous sheet of material that is applied at one time, the junctions are homogeneous, uniform, and stable. Performance is therefore reliable and predictable.

The metallic composition of junctions 30, and the metallurgical techniques employed in the fabrication thereof, insure low electrical contact resistance and maximum operating voltage across thermoelements 20 and 22. Consequently, input energy dissipation is reduced, heat transfer rate and temperature differential are enhanced, and parastic heat loading is minimized.

The high thermal and electrical conductivity of junctions 30 effectively remove the previous limitations and restrictions from the design characteristics of thermoelements 20 and 22.

Sudden changes in heat flux through junctions 30 are incapable of generating substantial thermal shock forces due to the composition, geometry, construction and other physical properties of the junctions. Thus fracturing and other types of thermal deterioration are essentially precluded.

Due to the excellent mechanical properties of junctions 30, a more-than-adequate degree of structural strength is incorporated into thermoelectric device 10 by the junctions. Therefore, the necessity for separate or supplemental physical conjoining in any thermoelectric system is obviated.

The low vapor pressure of junctions 30 in the presence of highly evacuated environments broadens the application range of any thermoelectric system, notably into the area of radiation detection.

Since plates 32 are of high dielectric strength, thermal conductivity, and mechanical strength, stages 16 and 18 are thermally-integrated and electrically-isolated, thermoelements 20 and 22 at the ends thereof within each stage are thermally-integrated, the thermoelements within each stage are electrically-isolated in a controllable predetermined manner, and thermoelectric device 10 is endowed with physical integrity.

A preferred mode of practicing the invention, and one embodiment thereof, have been described and illustrated. Variations of the details presented here however will undoubtedly occur to those skilled in the art without departing from the essential teachings of the invention. The invention therefore, is not to be limited to any greater extent than by the appended claims.

I claim:

1. In a cascaded thermoelectric assembly, the combination of:

a relatively thin thermally-conductive, electrically-nonconductive plate having first and second sides;
a layer of electrically-conductive silver preparation fired on said first side of said plate;
a layer of copper electroplated on said layer of silver preparation;
a layer of solder sweated on said layer of electroplated copper;
selected portions of said first side of said plate being free of said layers of silver preparation, cooper and solder to form a plurality of thermally-integrated, electrically-segregated, electrically-conductive portions;
a relatively thick copper bar bonded to each of said electrically-conductive portions;
a plurality of p-type thermoelectric elements each having an end bonded to one of said copper bars; and
a plurality of n-type thermoelectric elements each having an end bonded to one of said copper bars in proximate spaced relationship to one of said p-type thermoelectric elements;
said copper bars, p-type thermoelectric elements, and n-type thermoelectric elements thereby forming a continuous electrically-conductive path.

2. In a cascaded thermoelectric assembly, the combination of:

a relatively thin thermally-conductive, electrically-nonconductive plate having first and second sides;
a layer of electrically-conductive silver preparation fired on each side of said plate;
a layer of copper electroplated on each layer of said silver preparation;
a layer of solder sweated on each layer of said electroplated copper;
selected portions of each side of said plate being free of said layers of silver preparation, copper, and solder to form a plurality of thermally-integrated, electrically-segregated, electrically-conductive portions;
a relatively thick copper bar bonded to each of said electrically-conductive portions;
a plurality of p-type thermoelectric elements each having an end bonded to one of said copper bars; and
a plurality of n-type thermoelectric elements each having an end bonded to one of said copper bars in proximate spaced relationship to one of said p-type thermoelectric elements;
said thermoelectric elements and said copper bars on said first side of said plate thereby forming a first continuous electrically-conductive path, and said thermoelectric elements and said copper bars on said second side of said plate thereby forming a second continuous electrically-conductive path that is electrically-segregated from said first path.

3. In a cascaded thermoelectric assembly, the combination of:

a plurality of relatively, thin, spaced, parallel, aligned, thermally - conductive, electrically - nonconductive plates having first and second sides;
a layer of electrically-conductive silver preparation fired on each side of said plates;
a layer of copper electroplated on each layer of said silver preparation;
a layer of solder sweated on each layer of said copper;
selected portions of each side of said plate being free of said layers of silver preparation, copper, and solder to form a plurality of thermally-integrated, electrically-segregated, electrically-conductive portions;

a relatively thick copper bar bonded to each of said electrically-conductive portions;

a plurality of p-type thermoelectric elements having first and second ends bonded to copper bars located on respectively opposed sides of adjacent plates; and a plurality of n-type thermoelectric elements having first and second ends bonded to copper bars located respectively on opposed sides of adjacent plates;

said thermoelectric elements and copper bars thereby forming a continuous electrically-conductive path between adjacent plates, and said plates thereby serving to thermally-integrate and electrically-segregate the thermoelectric elements bonded to said first side of each plate from the thermoelectric elements bonded to said second side of each plate.

4. A method for fabricating a thermoelectric interstage carrier to physically, thermally, and electrically interconnect in a predetermined manner a plurality of thermoelectric elements comprising the steps of:

providing a relatively thin thermally-conductive, electrically-conductive plate having first and second sides;

applying a layer of electrically-conductive metallic preparation to each of said sides;

firing said layers of metallic preparation to said sides of said plate to effect a bond therebetween;

electroplating a layer of metal on each layer of said metallic preparation;

sweating a layer of metallic alloy on each layer of electroplated metal;

removing selected portions of said layers of metallic preparation, electroplated metal and metallic alloy to form a plurality of thermally-integrated, electrically-segregated, electrically-conductive portions on each side of said plate;

providing a plurality of relatively thick metal bars;

bonding one of said metal bars to each of said electrically-conductive portions;

providing a plurality of p-type and n-type thermoelectric elements having first and second ends;

joining each of said p-type thermoelectric elements at one end thereof to one of said metal bars; and joining each of said n-type thermoelectric elements at one end thereof to one of said metal bars in spaced relationship to one of said p-type thermoelectric elements;

the thermoelectric elements on said first side of said plate being thereby thermally-integrated and electrically-segregated from the thermoelectric elements on said second side of said plate.

5. In a thermoelectric assembly, the combination of:

a relatively thin thermally-conductive, electrically-nonconductive plate;

a layer of electrically-conductive silver preparation fired on at least one side of said plate;

a layer of copper electroplated on said layer of silver preparation;

a layer of solder sweated on said layer of electroplated copper;

selected portions of said plate being free of said layers of silver preparation, copper and solder to form a plurality of thermally-integrated, electrically-segregated, electrically-conductive portions;

a relatively thick copper bar bonded to each of said electrically-conductive portions;

a plurality of p-type thermoelectric elements each having an end bonded to one of said copper bars; and a plurality of n-type thermoelectric elements each having an end bonded to one of said copper bars in proximate spaced relationship to one of said p-type thermoelectric elements;

said copper bars, p-type thermoelectric elements, and n-type thermoelectric elements thereby forming a continuous electrically-conductive path.

References Cited by the Examiner

UNITED STATES PATENTS

| | | | |
|---|---|---|---|
| 2,684,522 | 7/1954 | Khouri | 29—195 |
| 2,844,638 | 7/1958 | Lindenblad | 136—4.2 |
| 2,921,973 | 1/1960 | Heikes et al. | 136—4.2 |
| 2,992,538 | 7/1961 | Poganski | 136—4.2 |

OTHER REFERENCES

Cannon, M. C.: How To Bond Sapphire to Other Materials, American Machinist, Aug. 29, 1946, p. 129.

WINSTON A. DOUGLAS, *Primary Examiner.*

JOHN R. SPECK, *Examiner.*

D. L. WALTON, A. B. CURTIS, *Assistant Examiners.*